(12) United States Patent
Nakada et al.

(10) Patent No.: US 11,696,513 B2
(45) Date of Patent: *Jul. 4, 2023

(54) MAGNETORESISTANCE EFFECT ELEMENT AND METHOD FOR MANUFACTURING THE SAME

(71) Applicant: TDK CORPORATION, Tokyo (JP)

(72) Inventors: Katsuyuki Nakada, Tokyo (JP); Shinto Ichikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/168,579

(22) Filed: Feb. 5, 2021

(65) Prior Publication Data

US 2021/0159396 A1 May 27, 2021

Related U.S. Application Data

(62) Division of application No. 16/025,171, filed on Jul. 2, 2018, now Pat. No. 10,944,043.

(30) Foreign Application Priority Data

Jul. 14, 2017 (JP) .................................. 2017-138383

(51) Int. Cl.
*H01L 43/12* (2006.01)
*H01L 43/08* (2006.01)
(Continued)

(52) U.S. Cl.
CPC ............. *H10N 50/80* (2023.02); *H10N 50/01* (2023.02); *H10N 50/10* (2023.02); *H10N 50/85* (2023.02)

(58) Field of Classification Search
CPC ......... H01L 43/02; H01L 43/08; H01L 43/10; H01L 43/12; H01L 27/222
See application file for complete search history.

(56) References Cited

U.S. PATENT DOCUMENTS 10,468,589 B2    11/2019  Sasaki et al.
10,944,043 B2 *   3/2021  Nakada ................... H01L 43/12
(Continued)

FOREIGN PATENT DOCUMENTS

JP      2013-175615 A    9/2013
JP         5586028 B2    9/2014
(Continued)

OTHER PUBLICATIONS

Sukegawa et al., "Tunnel magnetoresistance with improved bias voltage dependence in lattice-matched Fe/spinel MgAl2O4/Fe(001) junctions;" Applied Physics Letters; vol. 96; May 27, 2010.
(Continued)

*Primary Examiner* — Alonzo Chambliss
(74) *Attorney, Agent, or Firm* — Oliff PLC

(57) ABSTRACT

This magnetoresistance effect element includes a first ferromagnetic layer, a second ferromagnetic layer, and a tunnel barrier layer which is interposed between the first and second ferromagnetic layers, wherein the tunnel barrier layer has a spinel structure represented by a compositional formula $X_{1-\alpha}Y_\alpha O_\beta$, and the tunnel barrier layer contains one or more additional elements selected from the group consisting of He, Ne, Ar, Kr, Xe, P, C, B, and Si, and in the compositional formula, X represents one or more elements selected from the group consisting of Mg, Zn, Cd, Ag, Pt, and Pb, Y represents one or more elements selected from the group consisting of Al, Ga, and In, a range of $\alpha$ is $0<\alpha\leq1$, and a range of $\beta$ is $0.35\leq\beta\leq1.7$.

15 Claims, 4 Drawing Sheets

(51) Int. Cl.
*H01L 43/10* (2006.01)
*H10N 50/80* (2023.01)
*H10N 50/01* (2023.01)
*H10N 50/10* (2023.01)
*H10N 50/85* (2023.01)

(56) References Cited

U.S. PATENT DOCUMENTS

| | | | |
|---|---|---|---|
| 2002/0052194 A1 | 5/2002 | Sivakumar | |
| 2006/0221511 A1 | 10/2006 | Saruki et al. | |
| 2007/0264728 A1* | 11/2007 | Miura | B82Y 25/00 438/73 |
| 2010/0080894 A1* | 4/2010 | Tsunekawa | H01L 27/222 427/131 |
| 2012/0091548 A1 | 4/2012 | Sukegawa et al. | |
| 2013/0003579 A1 | 1/2013 | Lu et al. | |
| 2013/0075837 A1 | 3/2013 | Chen et al. | |
| 2013/0221461 A1 | 8/2013 | Sukegawa et al. | |
| 2014/0284732 A1* | 9/2014 | Nagamine | H01L 43/12 257/421 |
| 2015/0069542 A1* | 3/2015 | Nagamine | H01L 43/08 257/421 |
| 2016/0154071 A1 | 6/2016 | Sasaki | |
| 2017/0062705 A1 | 3/2017 | Yamakawa et al. | |
| 2019/0157546 A1 | 5/2019 | Sasaki | |
| 2019/0198077 A1 | 6/2019 | Seo et al. | |
| 2019/0221230 A1 | 7/2019 | Sasaki | |
| 2019/0348600 A1 | 11/2019 | Xue et al. | |
| 2019/0355898 A1 | 11/2019 | Nakada | |

FOREIGN PATENT DOCUMENTS

| | | | | |
|---|---|---|---|---|
| JP | 5588019 B2 | 9/2014 | | |
| JP | 2016-105340 A | 6/2016 | | |
| WO | WO-2011026705 A1 * | 3/2011 | | H04B 17/382 |

OTHER PUBLICATIONS

Miura et al., "First-principles study of tunneling magnetoresistance in Fe/MgAl2O4/Fe(001) magnetic tunnel junctions;" Physical Review B; vol. 86; Jul. 20, 2012.
Scheike et al., "Lattice-matched magnetic tunnel junctions using a Heusler alloy Co2FeAl and a cation-disorder spinel Mg—Al—O barrier;" Applied Physics Letters, vol. 105; Dec. 17, 2014.
Mar. 6, 2020 Office Action issued in U.S. Appl. No. 16/025,171.
Jun. 18, 2020 U.S. Office Action issued U.S. Appl. No. 16/025,171.

* cited by examiner

MAGNETORESISTANCE EFFECT ELEMENT AND METHOD FOR MANUFACTURING THE SAME

CROSS REFERENCE TO RELATED APPLICATION

This application is a divisional application of U.S. application Ser. No. 16/025,171, filed Jul. 2, 2018, the contents of which are incorporated herein by reference.

BACKGROUND OF THE INVENTION

Field of the Invention

The present invention relates to a magnetoresistance effect element and a method for manufacturing the magnetoresistance effect element.

The present application claims priority on Japanese Patent Application No. 2017-138383 filed on Jul. 14, 2017, the content of which is incorporated herein by reference.

Description of Related Art

A giant magnetoresistance (GMR) element consisting of a multilayer film of a ferromagnetic layer and a nonmagnetic layer, and a tunnel magnetoresistance (TMR) element using an insulating layer (tunnel barrier layer or barrier layer) as a nonmagnetic layer have been known. In general, in comparison to the GMR element, the TMR element has high element resistance and a high magnetoresistance (MR) ratio. The TMR element has attracted attention as an element for a magnetic sensor, a high-frequency component, a magnetic head, and a magnetic random access memory (MRAM).

The TMR element can be classified into two types in accordance with a difference in the mechanism of tunnel transport of electrons. One type is a TMR element in which only a penetration effect (tunneling effect) of wave functions between ferromagnetic layers is used. The other type is a TMR element in which coherent tunneling is predominant. The coherent tunneling uses specific orbital transport of nonmagnetic insulating layers, which are tunneled when a tunneling effect is produced, and only electrons having a symmetric property of a specific wave function perform tunneling. In the coherent tunneling process, tunneling conductance depends strongly on a symmetry of wave functions in the ferromagnetic layers and a symmetry of evanescent states in the tunnel barrier layer, and one particular wave function with $\Delta 1$ symmetry, which has high spin polarization, is able to effectively couple from one of the ferromagnetic layers into the tunnel barrier and also couple from the tunnel barrier to the other ferromagnetic layer. It is known that the TMR element in which coherent tunneling is predominant obtains a MR ratio higher than that of the TMR element in which only a tunneling effect is used.

In order to obtain the coherent tunneling effect in a magnetoresistance effect element, it is necessary that two ferromagnetic metal layers and a tunnel barrier layer are crystalline and that interfaces between the two ferromagnetic metal layers and the tunnel barrier layer are crystallographically continuous.

As a tunnel barrier layer in which the coherent tunneling effect can be obtained, a MgO layer is widely known. In addition, an alternative material to MgO is also considered. For example, in Japanese Patent No. 5586028, $MgAl_2O_4$ having a spinel structure is reported as an alternative material to MgO. Japanese Unexamined Patent Application, First Publication No. 2013-175615 describes that Mg—Al—O having a disordered spinel structure is used for a tunnel barrier layer.

Japanese Unexamined Patent Application, First Publication No. 2013-175615 describes that the MR ratio obtained using a disordered spinel structure as a tunnel barrier layer (Japanese Unexamined Patent Application, First Publication No. 2013-175615) is higher than that obtained using a spinel structure as a tunnel barrier layer (Japanese Patent No. 5586028).

In the magnetoresistance effect elements described in Japanese Patent No. 5586028 and Japanese Unexamined Patent Application, First Publication No. 2013-175615, the MR ratio is increased by reducing lattice mismatch between the tunnel barrier layer and the ferromagnetic layer. However, a sufficiently high MR ratio may not be obtained even in the case where lattice matching is performed between the tunnel barrier layer and the ferromagnetic layer.

SUMMARY OF THE INVENTION

The present invention is contrived in view of the circumstances, and the present invention aims to provide a magnetoresistance effect element capable of realizing a high MR ratio.

The inventors have conducted intensive studies, and as a result, they found that in the case where a predetermined element is added to a material constituting a tunnel barrier layer, the crystal structure of the tunnel barrier layer is further disordered, and the MR ratio of a magnetoresistance effect element increases.

That is, the present invention provides the following solutions for solving the problems.

(1) A magnetoresistance effect element according to a first aspect includes a first ferromagnetic layer, a second ferromagnetic layer, and a tunnel barrier layer which is interposed between the first and second ferromagnetic layers, wherein the tunnel barrier layer has a spinel structure represented by a compositional formula $X_{1-\alpha}Y_\alpha O_\beta$, and the tunnel barrier layer contains one or more additional elements selected from the group consisting of He, Ne, Ar, Kr, Xe, P, C, B, and Si, and in the compositional formula, X represents one or more elements selected from the group consisting of Mg, Zn, Cd, Ag, Pt, and Pb, Y represents one or more elements selected from the group consisting of Al, Ga, and In, a range of $\alpha$ is $0 < \alpha \leq 1$, and a range of $\beta$ is $0.35 \leq \beta \leq 1.7$.

(2) In the magnetoresistance effect element according to the above aspect (1), the tunnel barrier layer may be an interstitial solid solution in which the additional element intrudes between crystal lattices of the spinel structure.

(3) In the magnetoresistance effect element according to the above aspect (1) or (2), the additional elements may be one or more elements selected from the group consisting of Ar, Kr, and Xe.

(4) In the magnetoresistance effect element according to any one of the above aspects (1) to (3), in the compositional formula, X may be Mg and Y may be Al.

(5) In the magnetoresistance effect element according to any one of the above aspects (1) to (4), at least one of the first ferromagnetic layer and the second ferromagnetic layer may be Fe or a CoFe alloy.

(6) A method for manufacturing a magnetoresistance effect element according to a second aspect includes laminating a first ferromagnetic layer, a tunnel barrier layer, and a second ferromagnetic layer, wherein in the lamination of the tunnel barrier layer, one or more additional elements selected from the group consisting of He, Ne, Ar, Kr, Xe, P, C, B, and Si which are ionized or turned into plasma are implanted into the tunnel barrier layer.

According to an aspect of the invention, it is possible to provide a magnetoresistance effect element in which a high MR ratio is obtained.

DETAILED DESCRIPTION OF THE INVENTION

Figure 1:
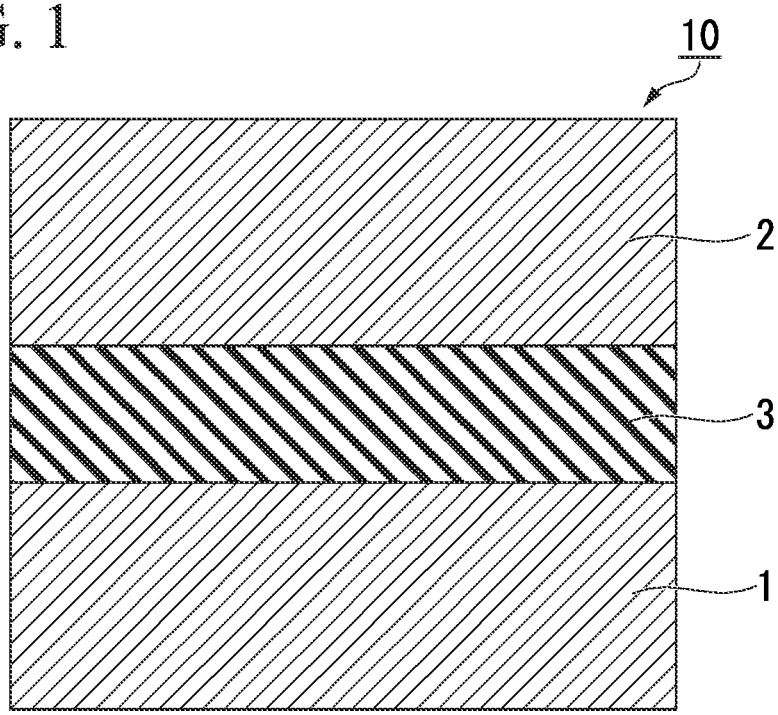
FIG. 1 is a schematic cross-sectional view of a magnetoresistance effect element according to an embodiment.

Hereinafter, the present embodiment will be described in detail with proper reference to the drawings. In the drawings used in the following description, characteristic portions may be shown in an enlarged manner for convenience in order to make the characteristics of the present embodiment easy to understand, and a dimensional ratio between constituent elements and the like may be different from actual ones. Materials, dimensions, and the like exemplified in the following description are merely examples, and the present invention is not limited thereto. Within a range where the features of the present invention do not change, materials, dimensions, and the like can be appropriately changed.

"Magnetoresistance Effect Element"

FIG. 1 is a schematic cross-sectional view of a magnetoresistance effect element according to the present embodiment. The magnetoresistance effect element 10 shown in FIG. 1 includes a first ferromagnetic layer 1, a second ferromagnetic layer 2, and a tunnel barrier layer 3. The magnetoresistance effect element 10 may include a cap layer, an underlayer, or the like other than the above-described layers.

(First Ferromagnetic Layer and Second Ferromagnetic Layer)

The first ferromagnetic layer 1 and the second ferromagnetic layer 2 have magnetization. The magnetoresistance effect element 10 outputs a change of a relative angle between the magnetizations of these layers as a change of a resistance value. For example, in the case where a magnetization direction of the second ferromagnetic layer 2 is fixed and a magnetization direction of the first ferromagnetic layer 1 is variable with respect to the magnetization direction of the second ferromagnetic layer 2, the resistance value of the magnetoresistance effect element 10 changes with a change of the magnetization direction of the first ferromagnetic layer 1. In general, a layer having a fixed magnetization direction is called a fixed layer, and a layer having a variable magnetization direction is called a free layer. Hereinafter, a description will be given using the case where the first ferromagnetic layer 1 is a free layer and the second ferromagnetic layer is a fixed layer as an example.

A ferromagnetic material can be used for the first ferromagnetic layer 1 and the second ferromagnetic layer 2. Examples thereof include a metal selected from the group consisting of Cr, Mn, Co, Fe, and Ni, an alloy including one or more metals selected from the above-described group, and an alloy including one or more metals selected from the above-described group and at least one or more elements of B, C, and N. Particularly, Fe or a CoFe alloy has high spin polarization. Thus, in the case where Fe or a CoFe alloy is used for the first ferromagnetic layer 1 or the second ferromagnetic layer 2, the MR ratio of the magnetoresistance effect element 10 can be increased. Specific examples of the first ferromagnetic layer 1 and the second ferromagnetic layer 2 include Co—Fe, Co—Fe—B, and Ni—Fe.

In addition, a Heusler alloy such as $Co_2FeSi$ or the like can be used for the first ferromagnetic layer 1 and the second ferromagnetic layer 2. The Heusler alloy has high spin polarization, and a high MR ratio can be obtained. The Heusler alloy includes an intermetallic compound having a chemical composition of $X_2YZ$, in which X represents a transition metal element or a noble metal element in Groups VIII to XI in the periodic table, Y represents a transition metal in Groups III to VII and can also represent the element represented by X, and Z represents a typical element in Groups III to V. Examples of the Heusler alloy include $Co_2FeSi$, $Co_2MnSi$, and $Co_2Mn_{1-a}Fe_aAl_bSi_{1-b}$.

In the case where the magnetization directions of the first ferromagnetic layer 1 and the second ferromagnetic layer 2 are set to be perpendicular to the lamination surface (plane), the thicknesses thereof are preferably 3 nm or less. Perpendicular magnetic anisotropy is induced to the first ferromagnetic layer 1 and the second ferromagnetic layer 2 at interfaces between the first and second ferromagnetic layers and the tunnel barrier layer 3. The effect of the perpendicular magnetic anisotropy is reduced in the case where the film thicknesses of the first ferromagnetic layer 1 and the second ferromagnetic layer 2 are large. Therefore, the first ferromagnetic layer 1 and the second ferromagnetic layer 2 preferably have a small film thickness.

In order to use the second ferromagnetic layer 2 as a fixed layer, the coercivity of the second ferromagnetic layer 2 is made larger than that of the first ferromagnetic layer 1. In the case where an antiferromagnetic material such as IrMn, PtMn or the like is provided adjacent to the second ferromagnetic layer 2, the coercivity of the second ferromagnetic layer 2 increases. In addition, in order to prevent a leakage magnetic field of the second ferromagnetic layer 2 from affecting the first ferromagnetic layer 1, the second ferromagnetic layer may have a synthetic ferromagnetic coupling structure.

(Tunnel Barrier Layer)

The tunnel barrier layer 3 has a spinel structure represented by a compositional formula $X_{1-\alpha}Y_\alpha O_\beta$. Herein, the "spinel structure" also includes a disordered spinel structure.

In the compositional formula, X represents one or more elements selected from the group consisting of Mg, Zn, Cd, Ag, Pt, and Pb. X is particularly preferably Mg among the elements. In the compositional formula, Y represents one or more elements selected from the group consisting of Al, Ga, and In. Among the elements, Al is particularly preferable. The range of $\alpha$ is $0<\alpha\leq 1$, and the range of $\beta$ is $0.35\leq\beta\leq 1.7$.

Figure 2:
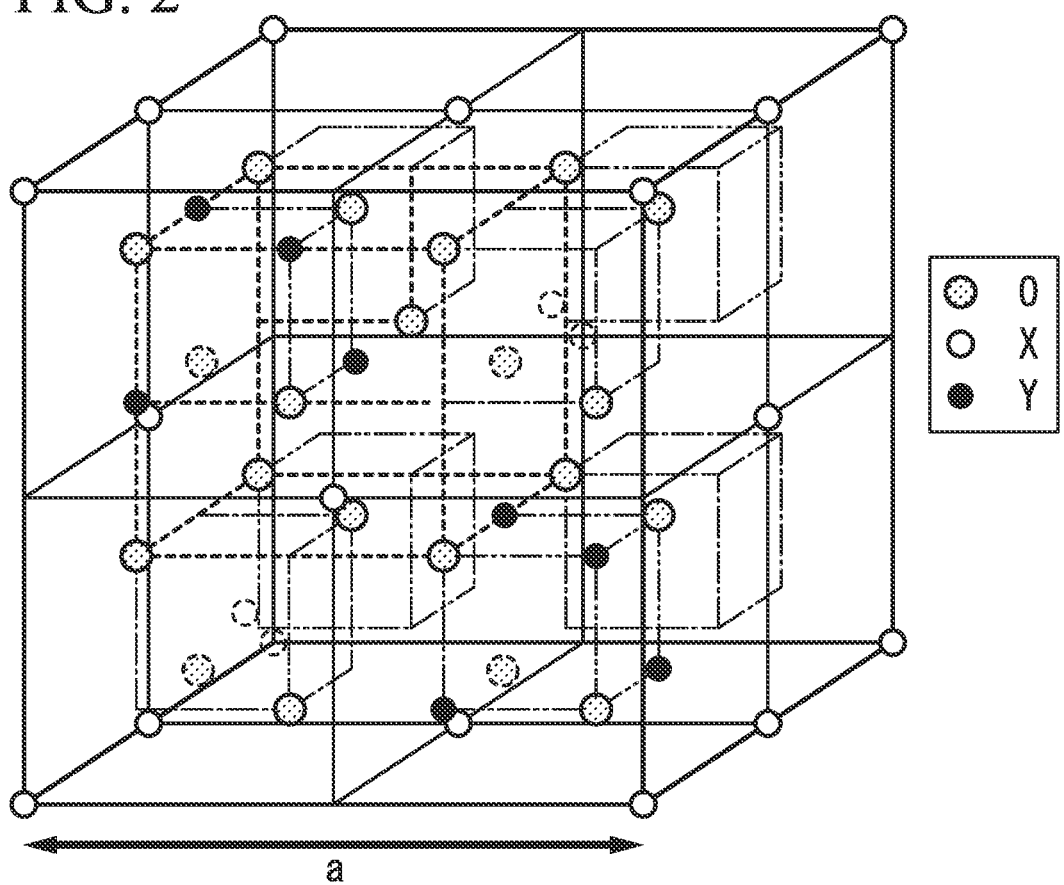
FIG. 2 is a diagram showing a crystal structure of a spinel structure.
Figure 3:
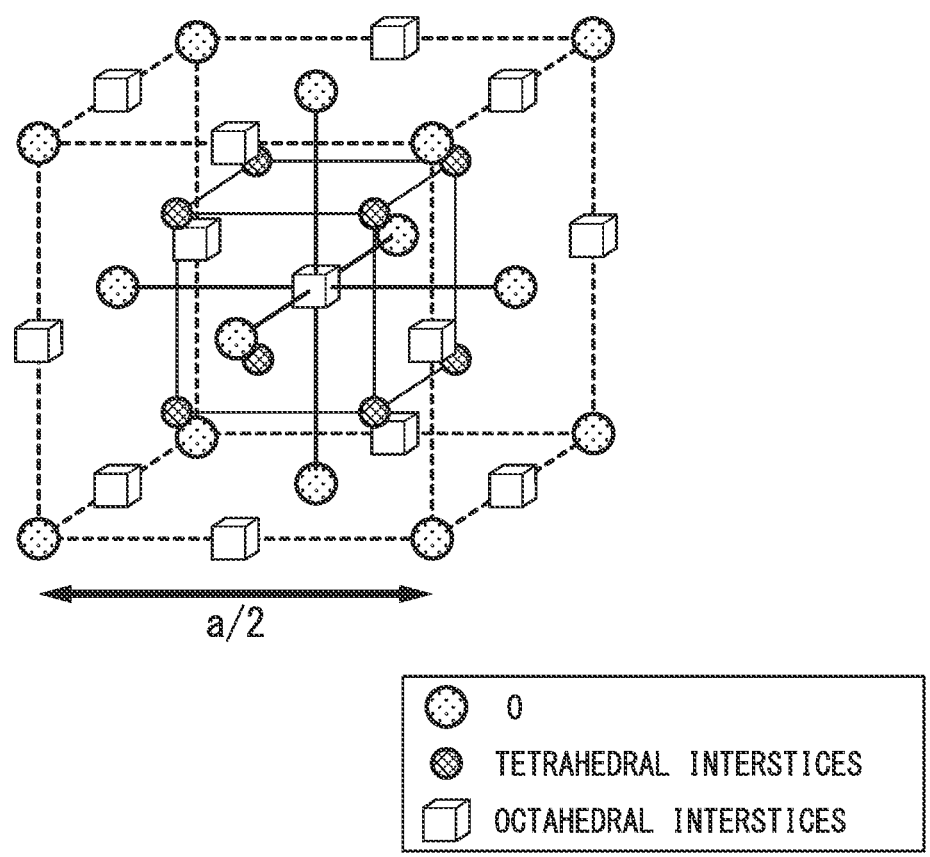
FIG. 3 is a diagram showing a crystal structure of a disordered spinel structure.

FIG. 2 is a diagram schematically showing a crystal structure of a spinel structure. FIG. 3 is a diagram schematically showing a crystal structure of a disordered spinel structure. In the spinel structure, as shown in FIG. 2, sites where an element X enters and sites where an element Y enters are fixed. Therefore, these elements are regularly arranged. In contrast, in the disordered spinel structure, an element X or Y can exist at any one of a site tetrahedrally coordinated with respect to oxygen shown in FIG. 3 and a site octahedrally coordinated with respect to the oxygen. Elements X and Y randomly enter any of these sites. In the case where elements X and Y having different atomic radii randomly enter these sites, the crystal structure is disordered. The lattice constant (a/2) of the disordered spinel structure is one-half of a lattice constant (a) of the ordered spinel structure.

In addition, the tunnel barrier layer 3 includes one or more additional elements selected from the group consisting of He, Ne, Ar, Kr, Xe, P, C, B, and Si. These additional elements induce distortion to crystal lattices, and thereby, disorder of the crystal structure is induced.

Figure 4:
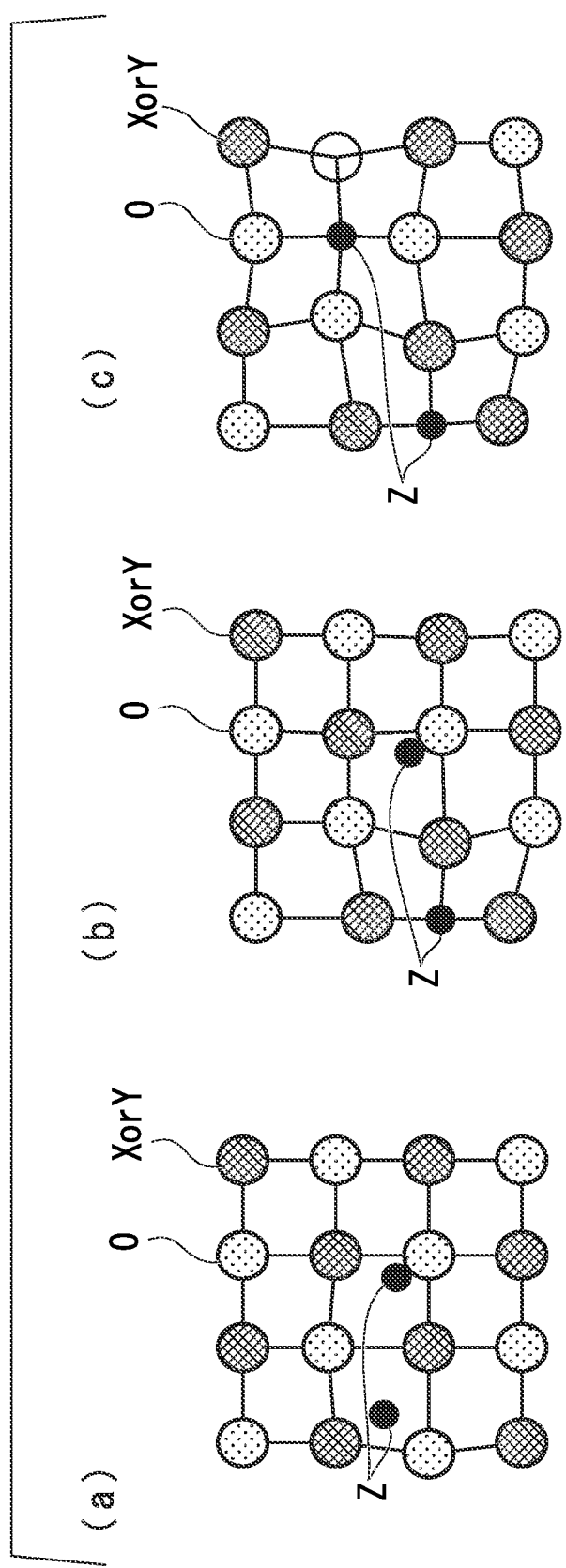
FIG. 4 shows diagrams of crystal lattices of a tunnel barrier layer of the magnetoresistance effect element according to the embodiment, viewed from one direction.

FIG. 4 shows diagrams of the crystal lattices of the tunnel barrier layer 3, viewed from one direction. As a method of mixing additional elements Z in the tunnel barrier layer 3, the additional elements Z may intrude between the crystal lattices, or the additional elements Z may be substituted with a part of elements constituting the crystal lattices. The former case is called an interstitial solid solution, and the latter case is called a substitutional solid solution.

FIG. 4(a) shows a case where additional elements Z intrude between the crystal lattices. FIG. 4(c) shows a case where additional elements Z are substituted with a part of elements constituting the crystal lattices. FIG. 4(b) shows a case where a part of additional elements Z intrudes between the crystal lattices, and another part of the additional elements Z is substituted with elements constituting the crystal lattices. There is a tendency that in the case where the tunnel barrier layer is a substitutional solid solution, the distortion of the crystal lattices of the tunnel barrier layer 3 is larger than that in the case where the tunnel barrier layer is an interstitial solid solution. Therefore, the degree of the distortion of the crystal lattices tends to increase in order of FIG. 4(a), FIG. 4(b), and FIG. 4(c).

The tunnel barrier layer 3 is preferably an interstitial solid solution. The additional elements Z are added in order to distort the crystal lattices. However, in the case where the crystal lattices are extremely distorted, the crystal structure changes, and the coherent tunneling effect of the tunnel barrier layer 3 is weakened. In the case where the tunnel barrier layer 3 is an interstitial solid solution, the crystal lattices can be distorted while the coherent tunneling effect can be sufficiently exhibited.

In the case where the tunnel barrier layer 3 is an interstitial solid solution, the additional elements Z are preferably one or more elements selected from the group consisting of Ar, Kr, and Xe. In an interstitial solid solution, the additional elements Z intrude between the crystal lattices. In the case where the additional element Z has a small atomic radius, the crystal lattices are not largely distorted even though the additional element Z is added. In order to distort the crystal lattices to some extent, the additional element Z preferably has a large atomic radius.

The above-described additional element Z is poorer in reactivity than the elements X and Y forming basic lattices. Accordingly, the additional element does not form an unnecessary chemical bond with the elements forming basic lattices in the crystal structure. Electron transfer associated with the chemical bond changes a change in the band structure of the tunnel barrier layer 3. In the case where the additional element has low reactivity, the coherent tunneling effect or the like of the tunnel barrier layer 3 is not inhibited even though the additional element is added to the tunnel barrier layer 3. From this viewpoint, it is preferable that the additional elements Z are one or more elements selected from the group consisting of He, Ne, Ar, Kr, and Xe.

As described above, the additional element Z can distort the crystal lattices while maintaining the coherent tunneling effect. In the case where the crystal lattices of the tunnel barrier layer 3 are distorted, the MR ratio of the magnetoresistance effect element 10 increases. The reason for this is not clear, but presumed as follows.

In the case where the crystal lattices of the tunnel barrier layer 3 are distorted, the interatomic spacing slightly varies by location. In this case, in the case where a crystal structure having disordered arrangement is selected, less forming energy is required than that in the case where a crystal structure having ordered arrangement is selected. That is, it is thought that disordered atomic arrangement is promoted, and thus the MR ratio of the magnetoresistance effect element 10 increases.

(Shape and Dimension of Element)

The laminate including the first ferromagnetic layer 1, the tunnel barrier layer 3, and the second ferromagnetic layer 2 that constitutes the magnetoresistance effect element 10 has a columnar shape. The laminate viewed in a plan view may have various shapes such as a circular shape, a quadrangular shape, a triangular shape, and a polygonal shape, but preferably has a circular shape in view of the symmetric property. That is, the laminate preferably has a cylindrical shape.

In the case where the laminate has a cylindrical shape, the diameter thereof in a plan view is preferably 80 nm or less, more preferably 60 nm or less, and even more preferably 30 nm or less. In the case where the diameter is 80 nm or less, a domain structure is not likely to be formed in the ferromagnetic layers, and it is not necessary to consider a component which is different from spin polarization in the ferromagnetic metal layers. Furthermore, in the case where the diameter is 30 nm or less, a single domain structure is formed in the ferromagnetic layers, and a speed or a probability of a magnetization reversal is improved. In addition, in a small-sized magnetoresistance effect element, there is a strong demand for a reduction in resistance.

(Others)

In the present embodiment, as the magnetoresistance effect element 10, an example of a top pin structure has been explained in which the first ferromagnetic layer 1 is a free layer and the second ferromagnetic layer 2 is a fixed layer. However, the structure of the magnetoresistance effect element 10 is not limited thereto, and a bottom pin structure may be used.

As described above, according to the magnetoresistance effect element 10 of the present embodiment, by adding a predetermined additional element Z, the crystal lattices can be distorted without the formation of a chemical bond. Therefore, the coherent tunneling of the tunnel barrier layer is maintained, and thus the MR ratio of the magnetoresistance effect element 10 can be increased.

The magnetoresistance effect element in which the present embodiment is utilized can be used as a magnetic sensor or a memory such as a MRAM or the like.

"Method for manufacturing Magnetoresistance Effect Element"

Next, a method for manufacturing a magnetoresistance effect element will be described.

The method for manufacturing a magnetoresistance effect element according to the present embodiment includes a step of laminating a first ferromagnetic layer, a tunnel barrier layer, and a second ferromagnetic layer. As a method of forming the layers, a known method such as a sputtering method, a vapor deposition method, a laser ablation method, a molecular beam epitaxy (MBE) method or the like can be used.

The tunnel barrier layer can be formed by a method including: subjecting a laminated metallic thin film to plasma oxidation or natural oxidation by introducing oxide; and subsequently performing a heat treatment. After or during the lamination of the tunnel barrier layer, an additional element which is ionized or turned into plasma is implanted into the tunnel barrier layer. As the method for implanting an additional element which is turned into plasma, for example, a reverse sputtering method can be used. In addition, as the method for implanting an ionized additional element, for example, an ion implantation method can be used.

The description will be given using the case where the reverse sputtering method is used as an example. First, a gas containing an additional element is introduced into a chamber in which a laminate including a tunnel barrier layer is installed, and glow discharge is generated. The additional element tuned into plasma through the glow discharge enters the tunnel barrier layer by a potential difference. In usual sputtering, a gas turned into plasma enters toward a target, however, by reversing the potential, the additional element turned into plasma can be allowed to enter the tunnel barrier layer. The entered additional element is incorporated into the tunnel barrier layer, and thus a tunnel barrier layer containing the additional element is formed.

As described above, according to the method for manufacturing a magnetoresistance effect element of the present embodiment, a predetermined additional element Z can be easily contained in the tunnel barrier layer.

EXAMPLES

Example 1-1

A magnetoresistance effect element 10 shown in FIG. 1 was produced on a MgO (001) substrate. First, a Cr layer having a thickness of 40 nm was laminated as an underlayer (also serving as a first line 15 to be described later) on the substrate, and a Fe layer having a thickness of 30 nm was laminated as a first ferromagnetic layer 1. Next, a film of an alloy of Mg and Al was formed and oxidized on the first ferromagnetic layer 1. Ar was implanted into the obtained Mg—Al—O layer by reverse sputtering. As a result, a Mg—Al—O layer containing Ar added thereto and having a thickness of 1.2 nm was obtained as a tunnel barrier layer 3. Next, a Fe layer having a thickness of 6 nm was laminated as a second ferromagnetic layer 2 on the tunnel barrier layer 3, and ferromagnetic tunnel junction was obtained. Next, an IrMn film having a thickness of 12 nm was formed as an antiferromagnetic layer, a Ru film having a thickness of 20 nm was formed as a cap layer (also serving as a second line 11 to be described later), and the magnetoresistance effect element 10 was obtained. Finally, a heat treatment was performed at a temperature of 175° C. while a magnetic field of 5 kOe was applied, and thereby, uniaxial magnetic anisotropy was induced to the second ferromagnetic layer 2.

The composition ratio of Ar contained in the tunnel barrier layer 3 was 0.01 at % or less. Herein, the composition ratio of Ar contained in the tunnel barrier layer 3 was obtained by a method including: producing a thin sample by focused ion beams; and performing energy dispersive X-ray analysis (EDS) in a transmission electron microscope (TEM). In this analysis method, a satisfactory analysis result could not be obtained with the thickness of the tunnel barrier layer 3. Accordingly, a plurality of Mg—Al—O layers containing Ar added thereto described above were laminated to secure a sufficient film thickness necessary for the measurement of the composition ratio, and then the composition ratio of Ar was measured. Herein, the composition ratio of Ar was defined as an atomic composition percentage (at %), and represented by 100×"number of Ar atoms"/("number of Mg atoms"+"number of Al atoms"+"number of O atoms"+ "number of Ar atoms"). The analysis method is not limited thereto, and secondary ion mass spectrometry (SIMS), an atom probe method, or electron energy loss spectroscopy (EELS) can also be used.

Figure 5:
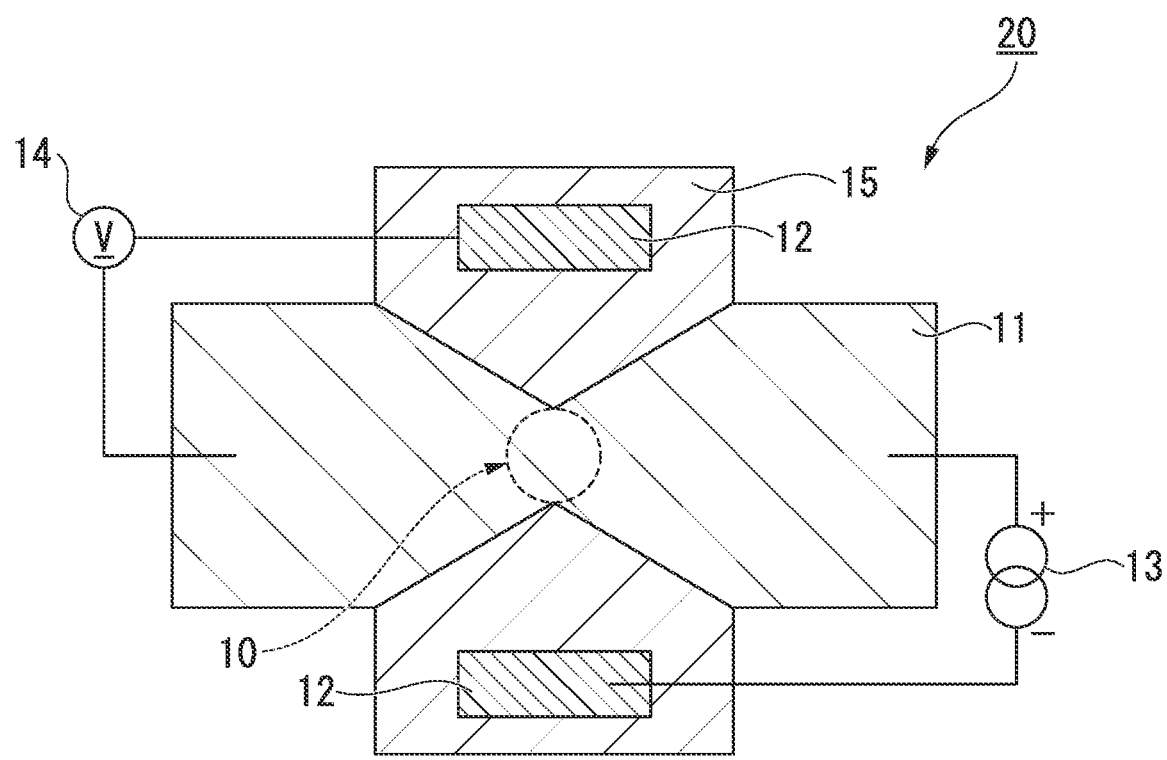
FIG. 5 is a schematic diagram of a magnetoresistance effect device used for the measurement of a MR ratio, viewed in a plan view from a lamination direction.

In addition, the MR ratio of the produced magnetoresistance effect element 10 was measured. FIG. 5 is a schematic diagram of a magnetoresistance effect device used for the measurement of the MR ratio, viewed in a plan view from a lamination direction. The magnetoresistance effect element 10 was provided at a position where a first line 15 intersected with a second line 11. The magnetoresistance effect element 10 had a cylindrical shape having a diameter of 80 nm. An electrode 12 was provided in the first line 15 and connected to a power supply 13 and a voltmeter 14. By applying a voltage by the power supply 13, a current flowed in the lamination direction of the magnetoresistance effect element 10. In this case, the potential difference of the magnetoresistance effect element 10 was monitored by the voltmeter 14. A change in the resistance of the magnetoresistance effect element was observed by applying a current or a voltage to the magnetoresistance effect element while sweeping a magnetic field from the outside to the magnetoresistance effect element 10.

In general, the MR ratio is represented by the following formula.

$$MR \text{ Ratio } (\%) = (R_{AP} - R_P)/R_P \times 100$$

$R_P$ represents resistance in the case where the magnetization directions of the first ferromagnetic layer 1 and the second ferromagnetic layer 2 are parallel to each other, and $R_{AP}$ represents resistance in the case where the magnetization directions of the first ferromagnetic layer 1 and the second ferromagnetic layer 2 are anti-parallel to each other. The measured result is shown in Table 1.

Examples 1-2 to 1-5

A magnetoresistance effect element 10 was produced under the same conditions as in Example 1-1, except that the composition ratio of Ar contained in the tunnel barrier layer 3 was changed by changing the conditions of the reverse sputtering. In addition, the composition ratio of Ar and the MR ratio were respectively measured by the same procedures as those for Example 1-1. The results are shown in Table 1.

TABLE 1

|  | Composition Ratio of Ar [at %] | MR Ratio [%] |
| --- | --- | --- |
| Example 1-1 | 0.01 or less | 110 |
| Example 1-2 | 0.049 | 112 |
| Example 1-3 | 0.098 | 125 |
| Example 1-4 | 1.1 | 123 |
| Example 1-5 | 9.9 | 124 |

Examples 2-1 to 2-5

A magnetoresistance effect element 10 was produced under the same conditions as in Example 1-1, except that the element implanted into the tunnel barrier layer was changed to Xe. In addition, the composition ratio of Xe and the MR ratio were respectively measured by the same procedures as those for Example 1-1. The results are shown in Table 2.

TABLE 2

|  | Composition Ratio of Xe [at %] | MR Ratio [%] |
|---|---|---|
| Example 2-1 | 0.003 or less | 110 |
| Example 2-2 | 0.016 | 116 |
| Example 2-3 | 0.032 | 130 |
| Example 2-4 | 0.29 | 132 |
| Example 2-5 | 3.1 | 133 |

Examples 3-1 to 3-4

A magnetoresistance effect element 10 was produced under the same conditions as in Example 1-1, except that the element implanted into the tunnel barrier layer was changed to B, and the implantation method was changed to an ion implantation method. In addition, the composition ratio of B and the MR ratio were respectively measured by the same procedures as those for Example 1-1. The results are shown in Table 3.

TABLE 3

|  | Composition Ratio of B [at %] | MR Ratio [%] |
|---|---|---|
| Example 3-1 | 0.04 or less | 109 |
| Example 3-2 | 0.2 | 111 |
| Example 3-3 | 0.39 | 113 |
| Example 3-4 | 3.7 | 114 |

EXPLANATION OF REFERENCES SIGNS

1: first ferromagnetic layer
2: second ferromagnetic layer
3: tunnel barrier layer
10: magnetoresistance effect element
11: second line
12: electrode
13: power supply
14: voltmeter
15: first line
20: magnetoresistance effect device

What is claimed is:
1. A magnetoresistance effect element comprising:
a first ferromagnetic layer;
a second ferromagnetic layer; and
a tunnel barrier layer which is interposed between the first and second ferromagnetic layers,
wherein the tunnel barrier layer has a crystal structure represented by a compositional formula $X_{1-\alpha}Y_\alpha O_\beta$, and the tunnel barrier layer contains one or more additional elements selected from the group consisting of He, Ne, Ar, Kr, Xe, C and B, and
in the compositional formula, X represents one or more elements selected from the group consisting if Mg, Zn, Cd, Ag, Pt, and Pb, Y represents one or more elements selected from the group consisting of Al, Ga, and In, a range of $\alpha$ is $0<\alpha\leq 1$, and a range of $\beta$ is $0.35\leq\beta\leq 1.7$.
2. The magnetoresistance effect element according to claim 1,
wherein the tunnel barrier layer is an interstitial solid solution in which the additional element intrudes between crystal lattices of the crystal structure.
3. The magnetoresistance effect element according to claim 2,
wherein the additional elements are one or more elements selected from the group consisting of Ar, Kr, and Xe.
4. The magnetoresistance effect element according to claim 3,
wherein at least one of the first ferromagnetic layer and the second ferromagnetic layer is Fe or a CoFe alloy.
5. The magnetoresistance effect element according to claim 2,
wherein at least one of the first ferromagnetic layer and the second ferromagnetic layer is Fe or a CoFe alloy.
6. The magnetoresistance effect element according to claim 1,
wherein the additional elements are one or more elements selected from the group consisting of Ar, Kr, and Xe.
7. The magnetoresistance effect element according to claim 6,
wherein at least one of the first ferromagnetic layer and the second ferromagnetic layer is Fe or a CoFe alloy.
8. The magnetoresistance effect element according to claim 1,
wherein at least one of the first ferromagnetic layer and the second ferromagnetic layer is Fe or a CoFe alloy.
9. The magnetoresistance effect element according to claim 1,
wherein the tunnel barrier layer is a substitutional solid solution in which the additional elements are substituted with a part of elements constituting crystal lattices.
10. The magnetoresistance effect element according to claim 1,
wherein the additional elements are one or more elements selected from the group consisting of Kr, Xe, C and B.
11. The magnetoresistance effect element according to claim 1,
wherein the composition ratio of the additional elements in the tunnel barrier layer is 0.003 at % or more and 9.9 at % or less.
12. A method for manufacturing a magnetoresistance effect element, the method comprising:
laminating a first ferromagnetic layer, a tunnel barrier layer, and a second ferromagnetic layer,
wherein in the lamination of the tunnel barrier layer, one or more additional elements selected from the group consisting of He, Ne, Ar, Kr, Xe, C and B, which are ionized or turned into plasma are implanted into the tunnel barrier layer the tunnel barrier layer has a crystal structure represented by a compositional formula $X_{1-\alpha}Y_\alpha O_\beta$, and
in the compositional formula, X represents one or more elements selected from the group consisting if Mg, Zn, Cd, Ag, Pt, and Pb, Y represents one or more elements selected from the group consisting of Al, Ga, and In, a range of $\alpha$ is $0<\alpha\leq 1$, and a range of $\beta$ is $0.35\leq\beta\leq 1.7$.
13. The method for manufacturing a magnetoresistance effect element according to claim 12,
wherein the one or more additional elements are turned into plasma and are implanted by a reverse sputtering method.
14. The method for manufacturing a magnetoresistance effect element according to claim 12,
wherein the one or more additional elements consists of Kr, Xe, C and B.
15. The method for manufacturing a magnetoresistance effect element according to claim 12, the tunnel barrier layer is formed by a method including: subjecting a laminated metallic thin film to plasma oxidation or natural oxidation by introducing oxide; and subsequently performing a heat treatment.

\* \* \* \* \*